United States Patent
Chiu et al.

(10) Patent No.: US 9,680,059 B2
(45) Date of Patent: Jun. 13, 2017

(54) FLIP CHIP LIGHT EMITTING DIODE AND METHOD FOR MANUFACTURING THE SAME

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/692,455

(22) Filed: Apr. 21, 2015

(65) Prior Publication Data
US 2015/0311413 A1 Oct. 29, 2015

(30) Foreign Application Priority Data
Apr. 24, 2014 (CN) .......................... 2014 1 0167575

(51) Int. Cl.
*H01L 33/58* (2010.01)
*H01L 33/00* (2010.01)
(Continued)

(52) U.S. Cl.
CPC .............. *H01L 33/22* (2013.01); *G02B 1/11* (2013.01); *H01L 21/302* (2013.01); *H01L 33/005* (2013.01); *H01L 33/0079* (2013.01); *H01L 33/44* (2013.01); *H01L 33/58* (2013.01); *H01L 2224/14* (2013.01); *H01L 2224/16225* (2013.01)

(58) Field of Classification Search
CPC ... H01L 33/005; H01L 33/0079; H01L 33/22; H01L 33/44; H01L 33/58; H01L 21/302
USPC ......... 257/13, 79, 88, 98, E33.005, E33.059, 257/E33.067, E33.068, E21.219, E21.318; 359/601; 438/27, 29, 46, 694
See application file for complete search history.

(56) References Cited

U.S. PATENT DOCUMENTS

| 8,288,781 B2 * | 10/2012 | Seo ........................ H01L 27/156 257/88 |
| 8,641,212 B2 * | 2/2014 | Park ........................ G02B 1/118 359/599 |

(Continued)

FOREIGN PATENT DOCUMENTS

| CN | 102234183 A | 11/2011 |
| CN | 103117347 A | 5/2013 |

(Continued)

*Primary Examiner* — Dao H Nguyen
(74) *Attorney, Agent, or Firm* — Steven Reiss (57) ABSTRACT

A flip-chip light emitting diode, including a substrate, an N-type semiconductor layer, a light emitting layer and a P-type semiconductor layer series mounted along a height direction of the flip-chip light emitting diode. A P electrode is formed on the P-type semiconductor layer and an N electrode is formed on the N-type semiconductor. A top surface of the substrate is away from the light emitting layer. A plurality of micron main portions is formed on the top surface. An outer surface of each main body has a plurality of nanometer protrusions. A method for manufacturing the flip chip light emitting diode is also provided.

1 Claim, 9 Drawing Sheets (51) Int. Cl.
    *H01L 21/302*     (2006.01)
    *H01L 33/22*     (2010.01)
    *H01L 33/44*     (2010.01)
    *G02B 1/11*     (2015.01)

(56) References Cited

U.S. PATENT DOCUMENTS

| | | | | |
|---|---|---|---|---|
| 8,941,124 | B2* | 1/2015 | Kojima | H01L 33/44 257/79 |
| 9,324,910 | B2* | 4/2016 | Wu | H01L 33/22 |
| 9,397,261 | B2* | 7/2016 | Kang | H01L 33/60 |
| 2006/0202223 | A1* | 9/2006 | Sackrison | H01L 33/22 257/99 |
| 2013/0128362 | A1* | 5/2013 | Song | B82Y 20/00 359/601 |
| 2013/0214245 | A1* | 8/2013 | Chang | H01L 33/20 257/13 |
| 2014/0124806 | A1* | 5/2014 | Lester | H01L 33/44 257/98 |
| 2014/0370630 | A1* | 12/2014 | Wakai | H01L 33/20 438/29 |

FOREIGN PATENT DOCUMENTS

| | | |
|---|---|---|
| TW | 201038780 A1 | 11/2010 |
| TW | 201324860 A1 | 6/2013 |
| TW | 201336121 A1 | 9/2013 |
| TW | 201414010 A | 4/2014 |

* cited by examiner

FLIP CHIP LIGHT EMITTING DIODE AND METHOD FOR MANUFACTURING THE SAME

CROSS-REFERENCE TO RELATED APPLICATIONS

This application claims priority to Chinese Patent Application No. 201410167575.2 filed on Apr. 24, 2014, the contents of which are incorporated by reference herein.

FIELD

The subject matter herein generally relates to a flip chip light emitting diode and a method for manufacturing the same.

BACKGROUND

A generally flip chip light emitting diode includes an N type semiconductor layer, a light active layer and a P type semiconductor layer arranged on a substrate in order. An N electrode is mounted on the N type semiconductor layer, and a P electrode is mounted on the P type semiconductor layer. Light emitted from the light active layer traverses through the N type semiconductor layer to illuminate. However, total reflection is prone to generate between an outer surface of the N type semiconductor. So the light is easily reflected back into and absorbed by the N type semiconductor. Thus, luminance of the flip chip light emitting diode is limited.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
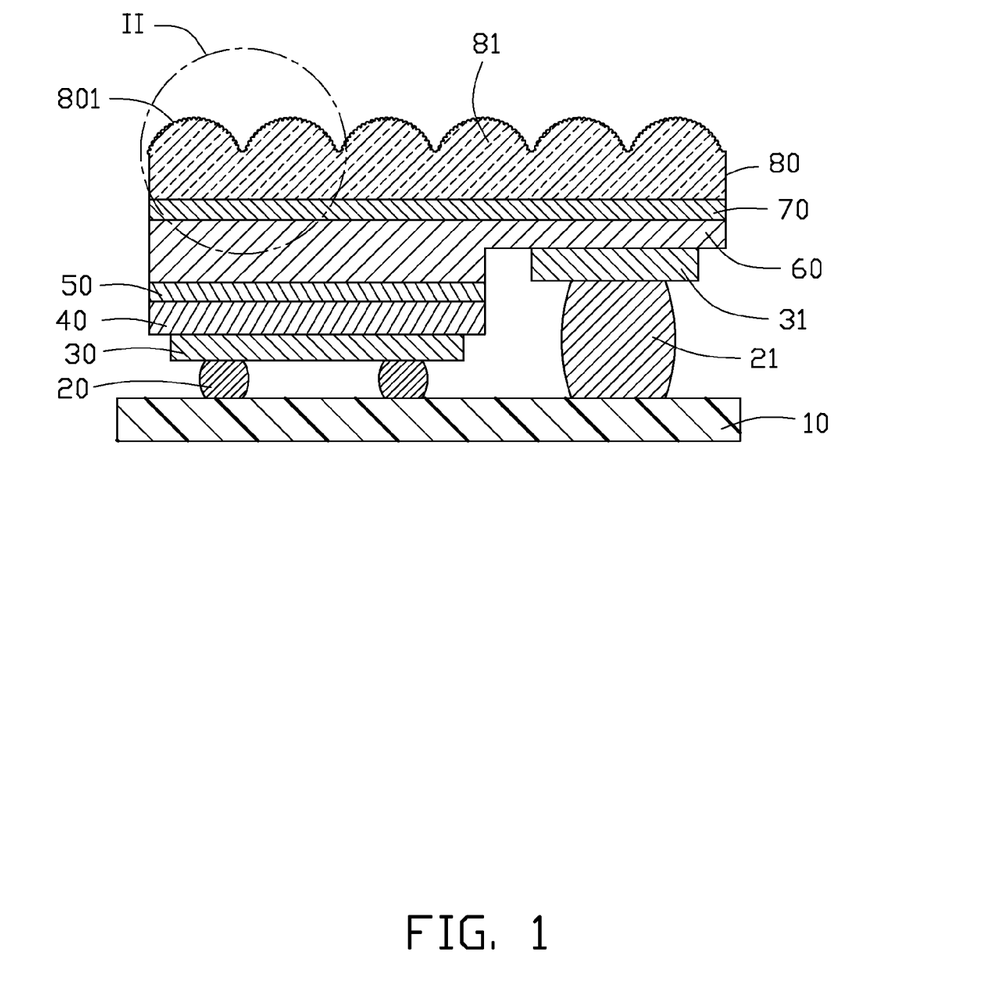
FIG. 1 is a cross sectional view of a flip chip light emitting diode of a first embodiment of the present disclosure.
Figure 2:
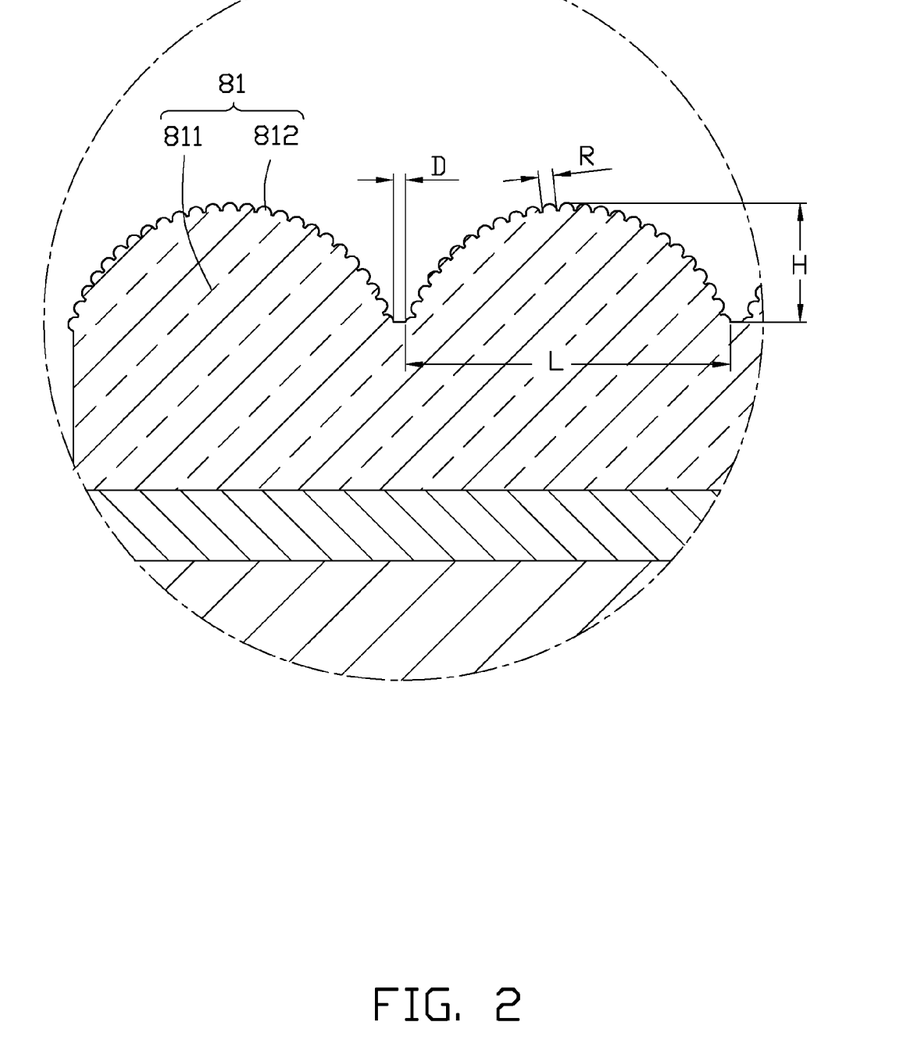
FIG. 2 is an enlarged view of a microstructure of the flip chip light emitting diode, taken along circle II of FIG. 1.

Referring to FIGS. 1-2, a flip chip light emitting diode of a first embodiment includes a microstructure 81, a substrate 80, a buffer layer 70, an N type semiconductor layer 60, a light emitting layer 50, and a P type semiconductor layer 40 are arranged along a height direction of the flip chip light emitting diode in series. A P electrode 30 is mounted on the P type semiconductor 40 and an N electrode 31 is mounted on the N type semiconductor layer 60. A first connecting portion 20 and a second connecting portion 21 connect the P electrode 30 and the N electrode 31 with a supporting plate 10 respectively.

The supporting plate 10 is made of heat dissipation material. The supporting plate 10 supports the flip chip light emitting diode thereon and absorbs heat from the flip chip light emitting diode.

The first connecting potion 20 and the second connecting portion 21 are made of metallic material, such as Sn, Pb, Au etc. The first connecting portion 20 is aligned with the P electrode 30 with the supporting plate 10, the second connecting portion 21 is aligned with the N electrode 31 with the supporting plate 10.

The P electrode 30, and the N electrode 31 are made of mentallic material, such as Al, Ag, Ni, Au, Cu, etc. A height of each the P electrode 30 and the N electrode 31 is varied between 200 nm and 5000 nm.

The P type semiconductor 40 is made of P—GaN and generates holes. The N type semiconductor 60 is made of AlGaN and generates electrons. The light emitting layer 50 holds the electrons and holes together to emit light. The buffer layer 70 is made of GaN and reduces the lattice defects of the N type semiconductor 60.

The substrate 80 is made of sapphire and has good mechanical strength. The substrate 80 has a first surface substantially facing towards the N-type semiconductor and a second surface 801, opposite the first surface, facing away from the N-type semiconductor. The microstructure 81 is formed on the second surface 801.

The microstructure 81 includes a plurality of micron main portions 811 and a plurality of nanometer protrusions 812 protruded from an outer surface of each micron main portions 811. The micron main portions 811 are spaced from each other. Each micron main portion 811 protrudes from the top surface 801 of the substrate 80 and has a hemispherical configuration. The nanometer protrusions 812 are spaced from each other. Each of the nanometer protrusions 812 has a hemispherical configuration.

A length of the bottom end of each micron main portion 811 is L. The L is varied between 2 μm-7 μm. Preferred L is 3 μm. A height of each micron main portion 811 is H. The H is varied between 1 μm-2.5 μm. Preferred H is 1.6 μm. A distance between each two adjacent micron main portions 811 increases from bottom to top. A distance between the bottom end of two adjacent micron main portions is D. The D is varied between 0.2 μm-1 μm. Preferred D is 0.3 μm. A diameter of the nanometer protrusion 812 is R. The R is varied between 100 nm-1 μm. Preferred R is 200 nm.

In this disclosure, the micro main portion 811 and the nanometer protrusions 812 are formed on the top surface 801, so light emitted from the light emitting layer 50 can be reflected several times by the micro main portion 811 and the nanometer protrusions 812 to change the incidence angle of the light. Thus, a part of light total reflected back to the interior of the conventional LED will traverse through the micro main portion 811 and the nanometer protrusion 812 to illuminate. Therefore, luminance of the flip chip light emitting diode is improved. Furthermore, the micro main portion 811 and the nanometer protrusions 812 can reflect light oriented thereto to different directions to change the incidence angle of the light to further improve luminance of the flip chip light emitting diode.

Figure 3:
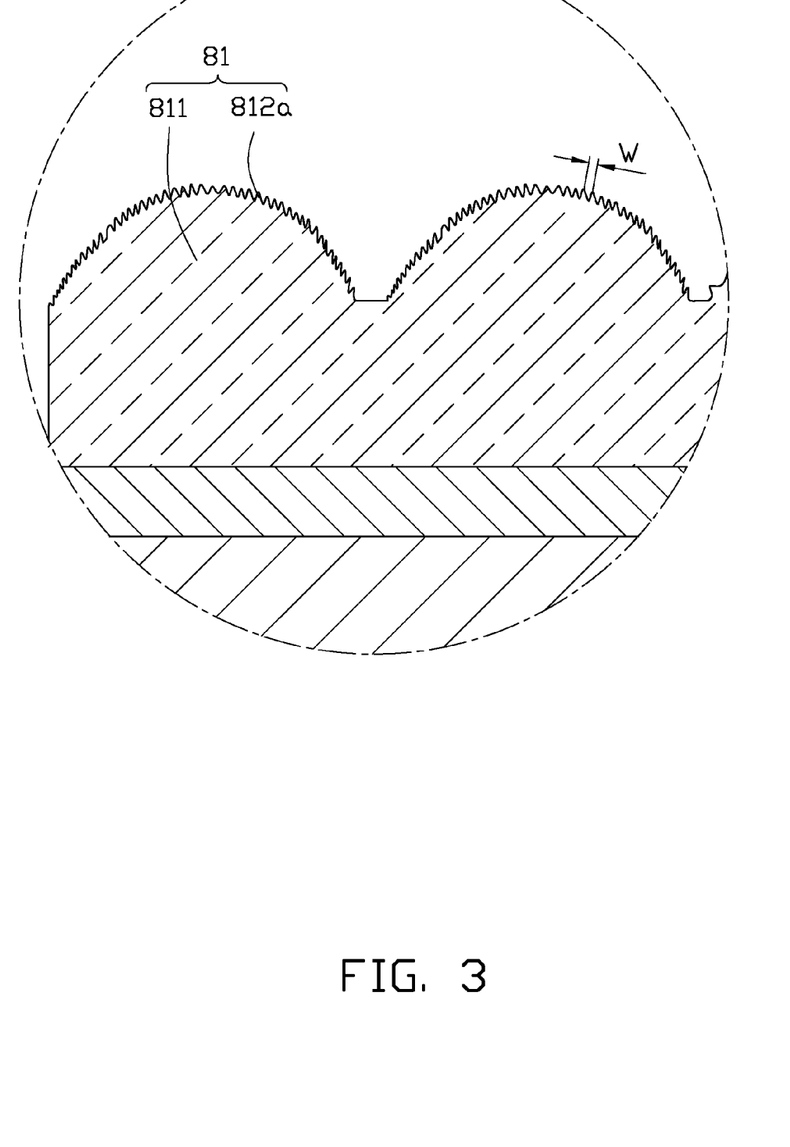
FIG. 3 is a partial enlarged view of a microstructure of the flip chip light emitting diode of a second embodiment of the present disclosure.

Referring to FIG. 3, in another embodiment, the nanometer protrusions 812a have zigzag shapes. A width of each nanometer protrusion 812a is W. The W is varied between 100 nm-1 μm. Preferred W is 200 nm.

Figure 4:
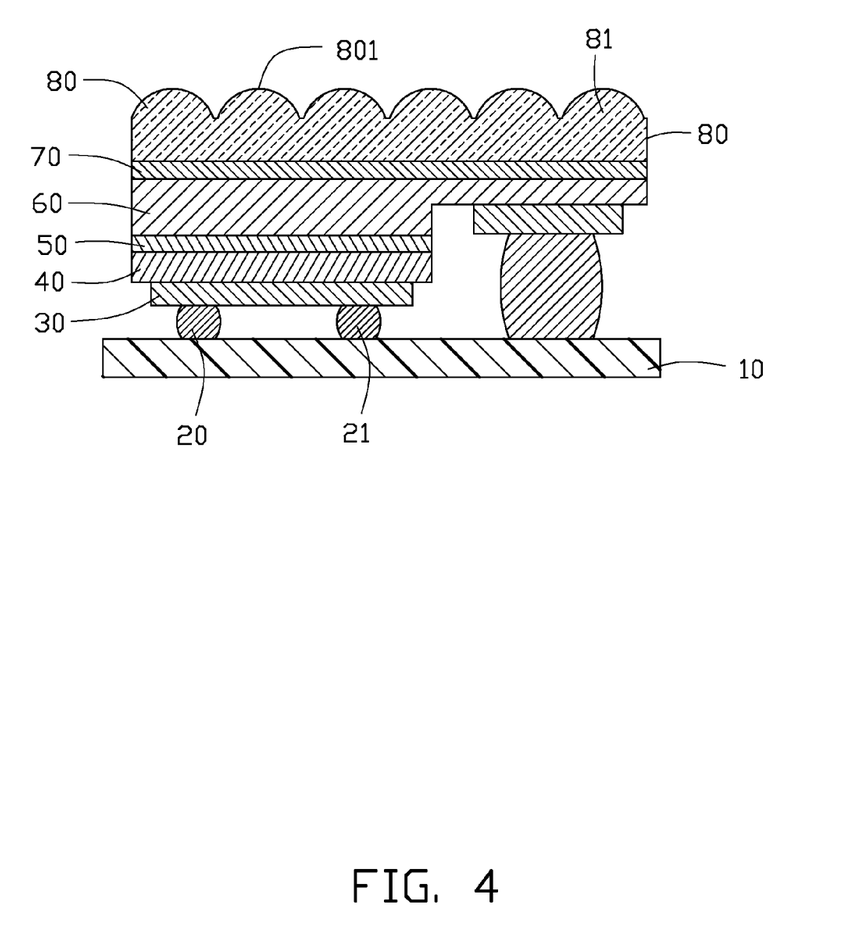
FIGS. 4-9 are manufacturing flow views of the flip chip light emitting diode of the present disclosure.

FIGS. 4-9 show a method for manufacturing the flip chip light emitting diode. The method mainly includes steps as disclosure below:

Referring to FIG. 4, providing a semi-finished flip chip light emitting diode. The semi-finished light emitting diode includes a substrate 80, a buffer layer 70, an N type semiconductor 60, a light emitting layer 50, a P type semiconductor 40, a P electrode 30 mounted on the P type semiconductor 40, an N electrode 31 mounted on the N type semiconductor 60, a first connecting portion 20 and a second connecting portion 21 connect the P electrode 30 and the N electrode 31 with a supporting plate 10.

Etching the top surface 801 of the substrate 80 to form a plurality of micron main portions 811. Each micron main portion 811 has a hemispherical configuration.

Figure 5:
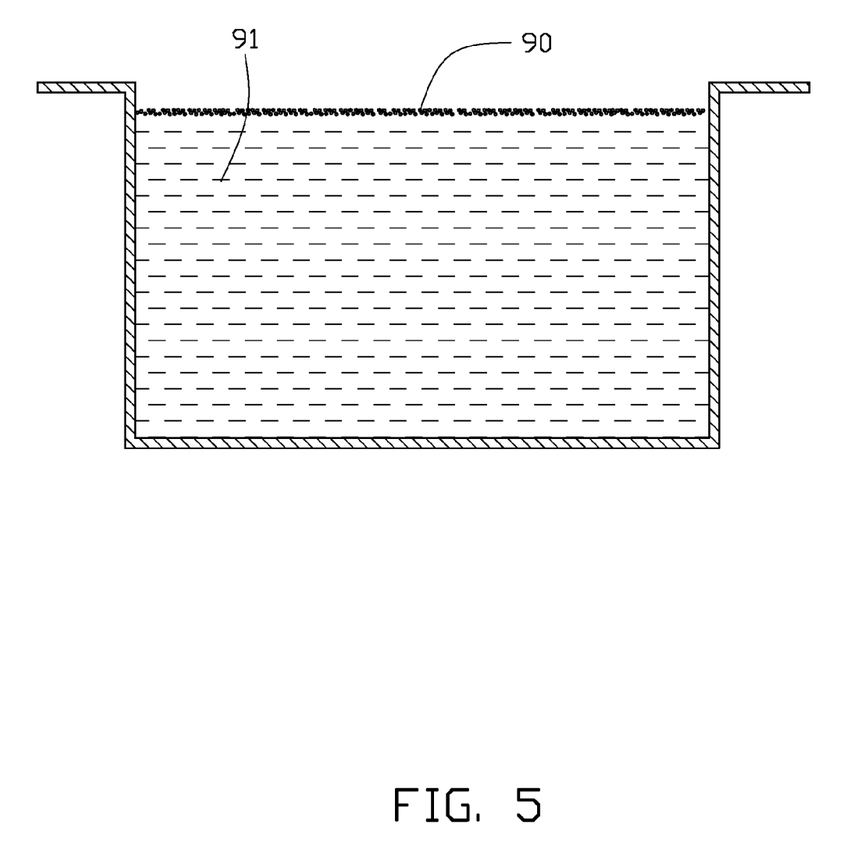

Referring to FIG. 5, providing a container filled with toluene 91 and nano-balls 90 made from silica. The density of the nano-ball 90 is smaller than that of the toluene 91, so the nano-balls 90 float above the toluene 91 in the container.

Figure 6:
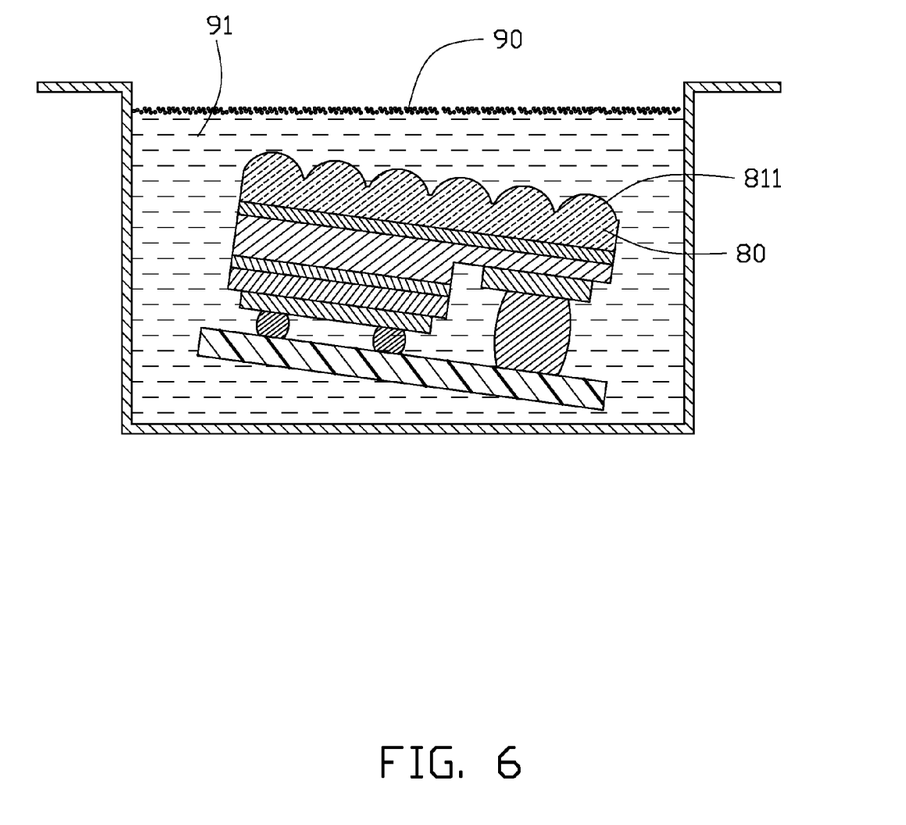

Referring to FIG. 6, putting the semi-finished flip chip emitting diode of FIG. 5 in the container. The nano-balls 90 move towards the outer surface of the micron main portions 811 functioned by the molecular force.

Figure 7:
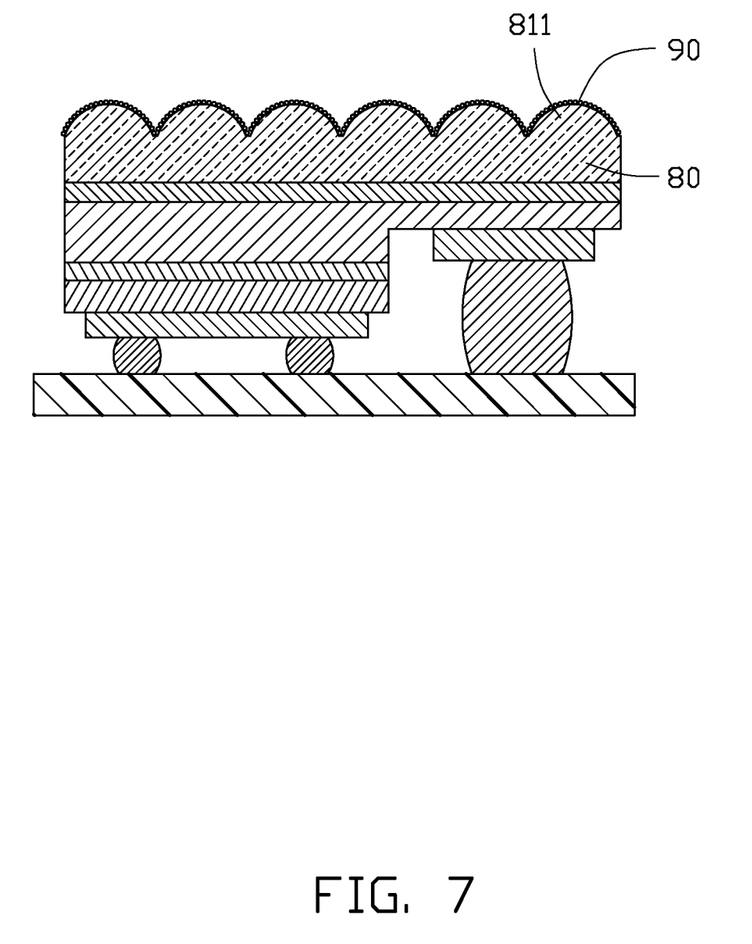

Referring to FIG. 7, after the toluene 91 evaporated from the container, all of the nano-balls 90 attaching on the top surface of the micron main portions 811.

Figure 8:
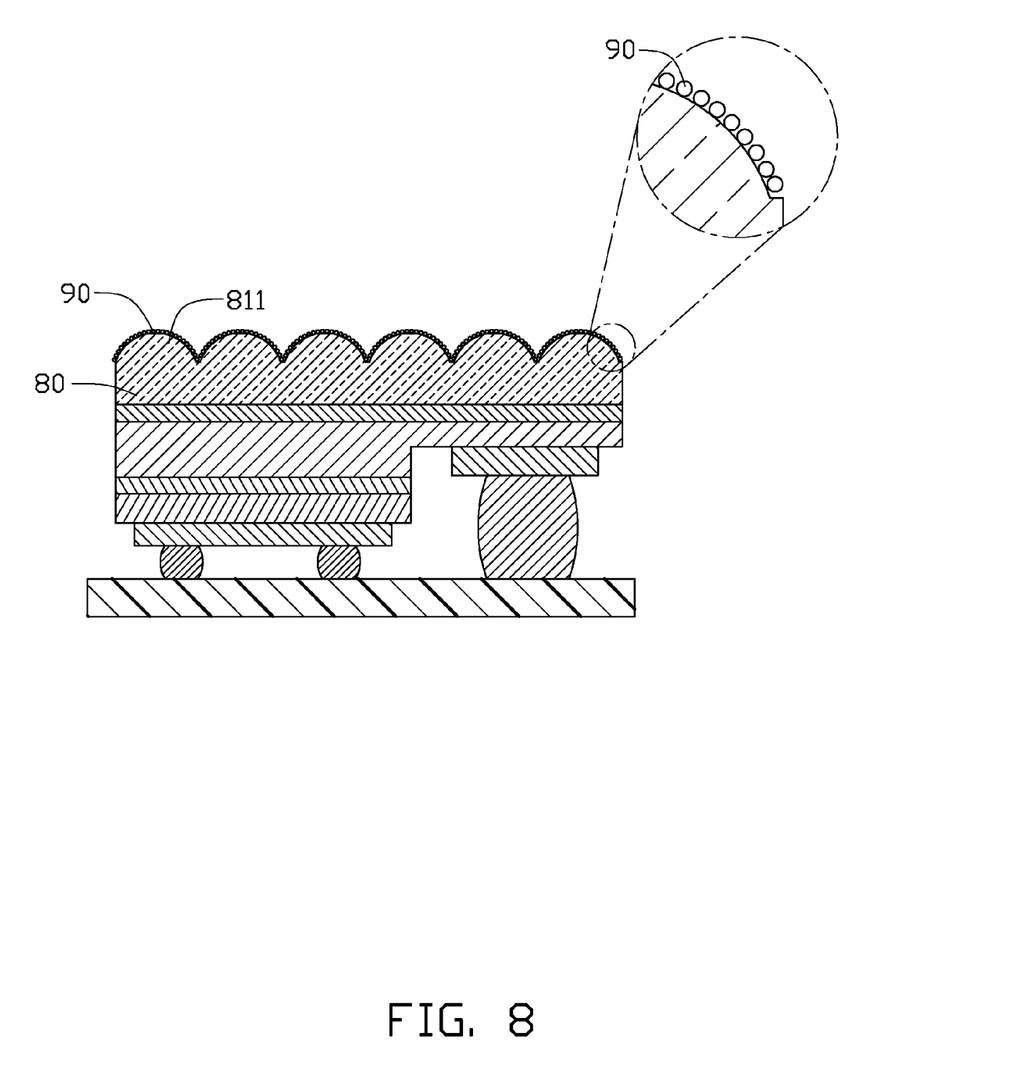

Referring to FIG. 8, transferring printing the nano-balls 90 in the micron main portions 811 by plasma etching machine.

Figure 9:
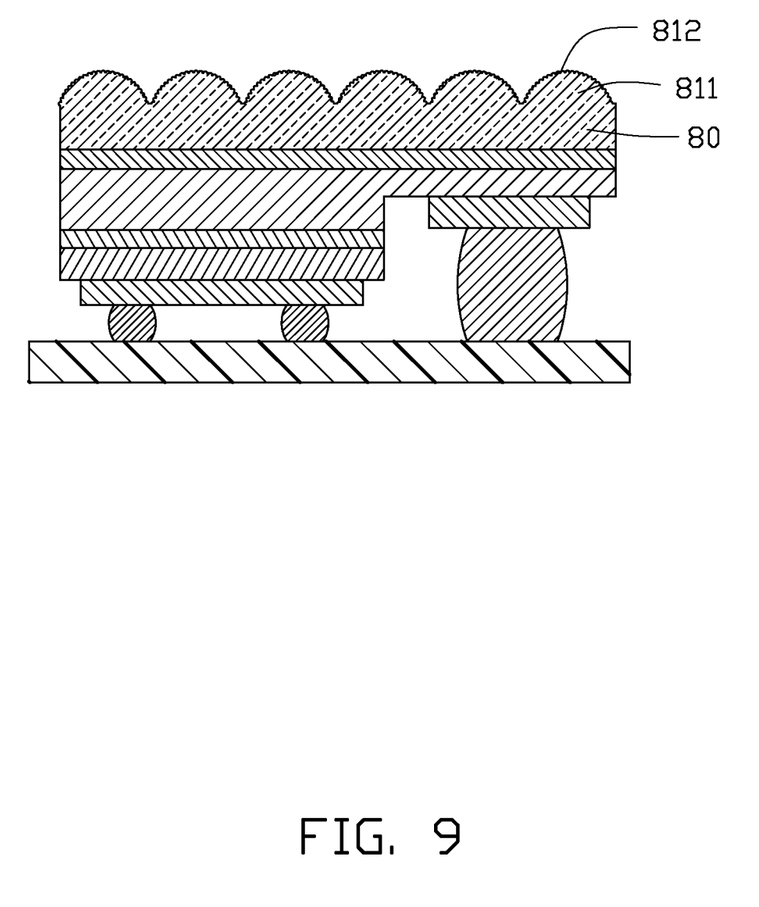

Referring to FIG. 9, removing the nano-balls 90 from the micron main portions 811 by the ultrasonic oscillator. Thus the nanometer protrusions 812 are formed on the top surface of the micron main portions 811. The flip chip light emitting diode is manufactured over.

In above manufacturing process of the flip chip light emitting diode of FIG. 8, transferring printing the nano-balls in the micron main portions 811 and forming the nanometer protrusions 812 is by the isotropic etching by plasma etching machine. It can be understood that transferring printing the nano-balls in the micron main portions 811 and forming the nanometer protrusions 812a is by the non isotropic etching by acid solution or alkaline solution. The method of manufacturing the flip chip light emitting diode is convenient and has low cost.

The embodiments shown and described above are only examples. Many details are often found in the art such as the other features of a flip chip light emitting diode and method for manufacture the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:
1. A flip chip light emitting diode comprising:
a P electrode;
an N electrode;
a P-type semiconductor mounted on the P electrode;
a light emitting layer mounted on the P-type semiconductor;
an N-type semiconductor mounted on the light emitting layer and on the N electrode; and
a substrate mounted on the N-type semiconductor, the substrate having a first surface substantially facing towards the N-type semiconductor and a second surface, opposite the first surface, facing away from the N-type semiconductor; and
a buffer layer located between the substrate and the N type semiconductor;
wherein, a microstructure is formed on the second substrate surface, the microstructure including a plurality of micron main portions with a plurality of nanometer protrusions protruding from an outer surface of each micron main portion, a distance between the bottom ends of two adjacent micron main portions is varied between 0.2-1 μm.

* * * * *